United States Patent [19]

Eklund

[11] Patent Number: 4,568,628

[45] Date of Patent: Feb. 4, 1986

[54] WATER DEVELOPABLE DIAZO PRINTING PLATE COMPOSITION WITH QUATERNARY NITROGEN STABILIZER

[75] Inventor: Nils Eklund, Cronton-on-Hudson, N.Y.

[73] Assignee: Polychrome Corporation, Yonkers, N.Y.

[21] Appl. No.: 663,783

[22] Filed: Oct. 23, 1984

Related U.S. Application Data

[63] Continuation of Ser. No. 420,754, Sep. 21, 1982, abandoned.

[51] Int. Cl.$^4$ .......................... G03C 1/60; G03F 7/08
[52] U.S. Cl. ..................................... 430/175; 430/141; 430/145; 430/157; 430/168; 430/169; 430/176; 430/178; 430/179; 430/302
[58] Field of Search ............... 430/175, 176, 178, 179, 430/169, 168, 157, 141, 145

[56] References Cited

U.S. PATENT DOCUMENTS

| | | | |
|---|---|---|---|
| 3,353,984 | 11/1967 | Landau | 430/156 |
| 3,660,097 | 5/1972 | Mainthia | 430/175 |
| 3,873,484 | 3/1975 | Bluestein et al. | 428/290 |
| 4,092,170 | 5/1978 | Houtermans et al. | 430/175 |
| 4,160,065 | 7/1979 | Loewrigkeit et al. | 428/423.1 |
| 4,224,398 | 9/1980 | Muzyczko et al. | 430/176 |
| 4,272,604 | 6/1981 | Meadov et al. | 430/176 |
| 4,288,520 | 9/1981 | Sprintschnik et al. | 430/175 |

FOREIGN PATENT DOCUMENTS 1280885  7/1972  United Kingdom ............... 430/175

Primary Examiner—Charles L. Bowers, Jr.

[57] ABSTRACT

A water developable printing plate is provided with a photopolymerizable system as a latex comprising a water soluble diazopolymer reaction product of a diazoaryl amine and an aldehyde and an aqueous cationic or nonionic dispersion of a water insoluble polymer. The inclusion of a water miscible organic solvent improves the shelf-life of the photopolymerizable system and the printing plate especially under high humidity conditions.

3 Claims, No Drawings

4,568,628

WATER DEVELOPABLE DIAZO PRINTING PLATE COMPOSITION WITH QUATERNARY NITROGEN STABILIZER

This application is a continuation of Ser. No. 420,754 filed Sept. 21, 1982 now abandoned.

BACKGROUND OF THE INVENTION

This invention relates to photopolymerizable systems which include photopolymerizable compositions that are light-sensitive latices which form water developable printing plates when coated on suitable backing members. Selected image areas can be insolubilized and crosslinked by exposure to actinic radiation and the composition in the non-radiated non-image areas can be washed away with water to provide the desired planographic image.

Emulsion photopolymerizable systems are taught in U.S. Pat. Nos. 4,186,069; 4,224,398; and 4,288,520. In these systems, the photopolymerizable coating is an emulsion mixture of a polymer component having water insoluble polymer particulates within an aqueous suspension medium, together with a water soluble or water dispersible light-sensitive component including a polymer having at least two moieties per molecule. Such polymers are sensitive to actinic radiation, and by generating a free radical or other crosslinking species form a matrix of crosslinked polymer which encapsulate or entrap therein and disperse therethrough the water insoluble polymer. Prior to curing this system is a three-phase emulsion including the water insoluble polymer particulates within the aqueous suspension medium with which is also mixed the light-sensitive polymer. When the coating composition is applied to a suitable backing member, the aqueous suspension is substantially removed to realize a two-phase mixture of the polymer particulates and light-sensitive polymer.

It has long been known to use water insoluble polymers in producing light-sensitive coatings for use on substrates such as planographic printing plates in which the polymers are incorporated as part of a solvent system layer which uses organic materials and which must be driven off from the plate, a requirement which is time and energy consuming, wasteful of solvents and possibly hazardous to the operator and the environment.

Use of water soluble systems generally avoids the disadvantages of the organic base systems, but they are not particularly long lasting because the polymers are water soluble and are therefore subject to erosion of the image area when in use and/or through the action of atmospheric moisture. The emulsion systems of the aforementioned patents provide an improved stability with respect to other water based systems, but they are still characterized by a shelf-life which is less than optimum, especially under high humidity conditions. Additionally, the images provided by such emulsion systems often include spots which are commercially unacceptable.

It is therefore the object of the present invention to provide a photopolymerizable system and a water developable printing plate based on such a system which exhibits improved properties, particularly with respect to shelf-life under high humidity conditions. This and other objects of the invention will become apparent to those skilled in this art from the following detailed description.

SUMMARY OF THE INVENTION

This invention relates to photopolymerizable compositions and printing plates therefrom, and more particularly to light-sensitive latex coating compositions which comprise a water soluble diazo polymer reaction product of a diazoarylamine and an aldehyde and an aqueous cationic or nonionic dispersion of water insoluble polymer. This system preferably contains a water miscible organic solvent which improves the shelf-life of the composition, especially under high humidity conditions.

DESCRIPTION OF THE INVENTION

The light-sensitive coating composition of the present invention is an emulsion mixture of a cationic or nonionic polar emulsion component having water insoluble polymer particulates within an aqueous suspension medium together with a water soluble or water dispersible component which is a diazo polymer reaction product of a diazoarylamine and an aldehyde. The water insoluble polymer emulsion component and the light-sensitive component are generally present in quantities of the same order of magnitude but can vary from a weight percent ratio of about 25:1 to 1:25, preferably about 5:1 to 1:5.

The water soluble diazo polymer used in the present invention are prepared by the well known condensation reaction of a diazoaryl amine such a p-diazodiphenylamine and an aldehyde such as formaldehyde or paraformaldehyde which results in the formation of an oligomer or low molecular weight polymer. Many such diazo polymers are commercially available and typical examples include Diazo-8000 sold by Polychrome Corporation of Yonkers, N.Y., which is a zinc chloride salt of the reaction product of para-diazodiphenylamine with paraformaldehyde, and Diazo Resin No. 4 of Fairmount Chemicals, which is a reaction product of para-diphenylamine diazonium chloride with formaldehyde. Salts of the reaction product of p-diazodiphenylamine with paraformaldehyde are especially preferred. Zinc chloride, phosphate, sulfate salts and the like can be utilized; the zinc chloride salts being preferred.

The aqueous dispersion of the water insoluble polymer of the present invention is cationic or nonionic either as a result of the use of an emulsifier or by having the cationic or nonionic group linked to the polymer. The water insoluble polymer is preferably a solid particulate having a size in the range of about 100 Angstroms to 10 microns in diameter. In general, any polymer which carries a cationic or nonionic group or which can be formulated into an emulsion using a cationic or nonionic emulsifier can be employed in the present invention. Suitable polymers include the homopolymers and copolymers of styrene, ethyl acrylate, butyl acrylate, ethyl methacrylate, butyl methacrylate, vinyl acetate, vinyl chloride, vinylidene chloride, butadiene, methylstyrene, vinyl toluene, dimethylaminoethyl acrylate, acrylic acid, methacrylic acid, isoprene, chloroprene, maleic anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

Various cationic and nonionic emulsions are commercially available and can be used in the practice of the present invention. For example, Witcobond W-212, a cationomeric polyurethane emulsion sold by Witco can be used in the present invention. Such emulsions are carried by U.S. Pat. Nos. 3,873,484 and 4,160,065; the disclosures of which are incoporated herein by reference. A typical nonionic emulsion is Vondic 1310F sold by Dainippon Inc., which is available as a polyurethane emulsion.

When it is desired to enhance the sensitivity of the light-sensitive diazo polymer, known sensitizers can be included in the composition. For example, the composition can contain Michler's ketone, benzoin, benzoin methyl ether and other well known sensitizers which may be water solubilized as required by the use of amines, amine salts, quaternary amines, or polyalkoxy groups.

The light-sensitive composition of the present invention generally contains stabilizers which are derivatives of pyridine-N-oxide or other quaternized ammonium compounds. Typical examples include nicotinamide-N-oxide, pyridine-N-oxide, quinoline-N-oxide, 4-nitroquinoline-N-oxide, tetramethyl ammonium chloride, dimethyldiallyl ammonium chloride. These stabilizers are present at a weight percent ratio range of from about 1:50 to 2:1, preferably 1:10 to 1:1, relative to said light-sensitive diazo polymers.

The compositions of the present invention can also include antihalation agents, dyes, pigments, fillers, plasticizers, extenders, crosslinked particles and other materials for aiding in maintaining or modifying the viscosity, plasticity and/or stability of the compositions. It will be appreciated that any dyes should be water soluble cationic or nonionic dyes although anionic dyes having at most one anionic group can also be used.

It has been found that the inclusion of a water miscible organic solvent in the aqueous dispersion of the water insoluble polymer improves the shelf-life of the composition especially under high humidity conditions. Typical organic solvents which can be used include methanol, ethanol, acetone, dimethylformamide, methylcellosolve, acetonitrile, dioxane, propanol, etc. The water miscible organic solvent will generally be about 0.1–75 weight percent, preferably about 1 to 40 weight percent, based on the weight of the total solvent system.

The photosensitive compositions of the present invention can be applied to any conventional substrate such as aluminum, copper, zinc, magnesium, steel or plastic, in any convenient fashion such as spray, roll or dip methods. After coating, the aqueous phase is evaporated or dried to remove the water or water and miscible organic solvent at low or elevated temperatures with or without imposition of a vacuum to leave the water insoluble emulsion and light-sensitive polymer together with a small amount of residual water or water and miscible organic solvent on the substrate. Areas of the composition which are exposed to actinic radiation harden and become hydrophobic, while the portions which are not so exposed remain water receptive and can be removed by simple water development.

In order to further illustrate the invention, various examples are set forth below. Throughout these examples, as well as throughout this specification and claims, all parts and percentages are by weight and all temperatures in degrees Centrigrade unless otherwise specified.

EXAMPLE I

A photopolymerizable composition was prepared by mixing 5.37 percent of a cationomeric polyurethane emulsion (Witcobond W-212) and 0.64 percent of a water soluble diazopolymer which was the zinc chloride salt of a reaction product of para-diazodiphenylamine and paraformaldehyde. The composition additionally contained 0.16 percent zinc chloride, 0.48 percent tris(2-chloroethyl)phosphate, 0.16 percent nicotinamide-N-oxide, 0.032 percent methyl green, 76.6 percent water and 16.5 percent dimethylformamide. The photosensitive composition was coated on a grained anodized and silicated sheet of aluminum and allowed to dry. The plate was thereafter exposed to ultraviolet radiation, developed with tap water and gummed in the conventional fashion. The resulting lithographic plate was found to produce 30,000 good quality copies. A sample of the thusly produced plate with a coating weight of 0.75 g/m$^2$ was subjected to accelerated shelf-life testing under high humidity conditions by exposure to 90 percent humidity at 38° C. for 120 h. The plate showed quite satisfactory properties in exposure speed, adhesion and development. Another sample subjected to accelerated shelf-life testing at 60° C. and low humidity for 120 h. also performed satisfactorily.

EXAMPLE II

The substrate used in the previous example was coated with an emulsion containing 4.09 percent of a nonionic polyurethane emulsion (Vondic 1310F, Dainippon Inc.) and 0.66 percent of the same diazopolymer used in Example I. The composition additionally contained 0.16 percent zinc chloride, 0.49% tris(2-chloroethyl)-phosphate, 0.16 percent nicotinamide-N-oxide, 0.25% Surfynol SE (Air Products Inc.), 0.04 percent Zonyl FSC (du Pont), 77.8 percent water and 16.4 percent 2-methoxyethanol(methylcellosolve). The composition was subjected to the same accelerated shelf life as in Example I without any negative effects.

Various changes and modifications can be made in the process and products of this invention without departing from the spirit and scope thereof. The various embodiments which have been disclosed herein were for the purpose of further illustrating the invention, but were not intended to limit it.

What is claimed is:

1. A light-sensitive latex composition to be coated having an improved shelf life under high humidity conditions consisting essentially of water in admixture with a water soluble diazo polymer reaction product of a diazoarylamine and an aldehyde, an aqueous cationic or nonionic dispersion of a water insoluble polymer, about 1 to 40% by weight, based on the weight of total solvent system, of a water miscible organic solvent, and a quaternary nitrogen-containing stabilizer selected from the group consisting of nicotinamide-N-oxide, pyridine-N-oxide, quinoline-N-oxide, 4-nitroquinoline-N-oxide, tetramethyl ammonium chloride, and dimethyldiallyl ammonium chloride; and wherein the diazo polymer, the water insoluble polymer, and the stabilizer are present in amounts sufficient to obtain, in conjunction with the organic solvent, a latex composition with improved shelf life under high humidity conditions.

2. The light-sensitive latex coating composition to be coated of claim 1 which additionally contains a compatible dye.

3. The light-sensitive latex composition to be coated of claim 1 which additionally contains a zinc salt.

* * * * *